United States Patent
Temple et al.

[11] Patent Number: 5,880,513
[45] Date of Patent: Mar. 9, 1999

[54] ASYMMETRIC SNUBBER RESISTOR

[75] Inventors: Victor A.K. Temple, Clifton Park; Stephen D. Arthur, Scotia; Sabih Al-Marayati, Schenectady; Eric X. Yang, Clifton Park, all of N.Y.

[73] Assignee: Harris Corporation, Melbourne, Fla.

[21] Appl. No.: 634,371

[22] Filed: Apr. 18, 1996

[51] Int. Cl.⁶ ............ H01L 23/58; H01L 29/00; H01L 29/93
[52] U.S. Cl. .......... 257/539; 257/489; 257/528; 257/532; 257/535; 257/536; 257/533; 257/539; 257/542; 257/546; 257/601
[58] Field of Search .................. 257/535, 542, 257/533, 532, 536, 539, 601, 528, 489, 546

[56] References Cited

U.S. PATENT DOCUMENTS

| | | | |
|---|---|---|---|
| 3,811,075 | 5/1974 | Shiga | 317/235 H |
| 4,223,328 | 9/1980 | Terasawa et al. | 257/149 |
| 4,366,522 | 12/1982 | Baker | 361/91 |
| 4,414,479 | 11/1983 | Foley | 307/253 |
| 4,641,175 | 2/1987 | Shiraishi | 257/149 |
| 5,001,537 | 3/1991 | Colman et al. | 257/603 |
| 5,371,385 | 12/1994 | Hayashi et al. | 257/603 |
| 5,430,311 | 7/1995 | Murakami et al. | 257/146 |
| 5,479,031 | 12/1995 | Webb et al. | 257/603 |
| 5,479,044 | 12/1995 | Narahara et al. | 257/533 |
| 5,479,045 | 12/1995 | Narahara et al. | 257/533 |
| 5,552,625 | 9/1996 | Murakami et al. | 257/489 |
| 5,612,568 | 3/1997 | Arai | 247/603 |

OTHER PUBLICATIONS

Raderecht, P.S., "A review of the 'shorted emitter' principle as applied to p–n–p–n silicon controlled rectifiers," *Int. Journal of Electronics*, vol. 31, No. 6 pp. 541–564 (1971).

Sze, S.M., *Physics of Semiconductor Devices*, John Wiley & Sons, pp. 351–354 (1981).

*Primary Examiner*—Mahshid D. Saadat
*Assistant Examiner*—Ida M. Soward
*Attorney, Agent, or Firm*—Jaeckle Fleischmann & Mugel, LLP

[57] ABSTRACT

An asymmetric snubber resistor in accordance with the present invention includes a cathode, an N+ region, an N− region, a plurality of P+ regions, and an anode. The N+ region is disposed over the cathode, the N− region is disposed over the N+ region, the plurality of P+ regions are disposed over the N− region, and the anode is disposed over the plurality of P+ regions and exposed portions of the N− region. The asymmetric snubber may also include N regions between the P+ regions. The asymmetric snubber resistor replaces the snubber diode and the snubber resistor in a typical snubber circuit.

24 Claims, 3 Drawing Sheets

ASYMMETRIC SNUBBER RESISTOR

FIELD OF THE INVENTION

This invention relates generally to a snubber circuit and, more particularly, to an asymmetric snubber resistor for a snubber circuit.

BACKGROUND OF THE INVENTION

When a switch opens and stops the flow of current from an inductive load, the voltage across the inductor load suddenly rises and keeps rising, trying to force current through the open switch. Eventually, the voltage may become high enough to force current through and destroy the switch. The above-described problem often occurs in high current and high voltage applications. Accordingly, to protect the switch a snubber circuit is coupled across the switch.

Referring to FIG. 1, one example of a circuit 10 with a transistor 12, an inductive load 14, and a snubber circuit 16 is illustrated. In the circuit, the collector C of transistor 12 is connected to a −V source and the emitter E of the transistor is connected to a +V source. An inductive load is connected to the emitter of transistor 12. The snubber circuit 16 is connected in parallel with transistor 12 to the emitter E and collector C. A first load 18 and a first diode 20 are connected in series between the emitter E and a +V source, a second diode 22 is also connected in parallel with transistor 12, and a second load 24 is connected between the snubber circuit 16 and the emitter E.

The snubber circuit 16 consists of a snubber capacitor, a snubber resistor 28, and a snubber diode 30. The snubber capacitor 26 has first and second capacitor terminals 32 and 34 with the first capacitor terminal 32 coupled to the emitter E of transistor 12 and the second capacitor terminal 34 connected to one terminal of the snubber resistor 28. The other terminal of the snubber resistor 28 is connected to the collector C of transistor 12. The snubber diode 30 is connected in parallel with the snubber resistor 28.

When transistor 12 is off and thus open, the full load current is blocked from flowing through transistor 12. Instead, the full load current $I_{load}$ is transferred to the snubber circuit 16 which charges the snubber capacitor 26 and turns the snubber diode 30 on. The snubber diode 30 must be able to temporarily conduct the full load current $I_{load}$ and must be able to block the system voltage.

When transistor 12 is on and thus closed, the full load current $I_{load}$ flows through transistor 12. Meanwhile, snubber capacitor 26 discharges through snubber resistor 28 and snubber diode 30 is turned off. Snubber resistor 28 must be able to handle high peak current dissipation and must be small enough to discharge snubber capacitor 26 before the next turn off event.

Although the above-described snubber circuit 16 works, the snubber circuit 16 has some problems and limitations. For example, in high current and high power voltage applications, snubber resistor 28 is not able to withstand some commonly occurring high peak currents and wattage. The size requirement for the current surge and wattage creates layout problems which result in high stray inductance and reduces the effectiveness of the snubber circuit 16.

SUMMARY OF THE INVENTION

An asymmetric snubber resistor in accordance with the present invention includes a first metal contact, a first region of a high concentration of a first conductivity type, a second region of a low concentration of the first conductivity type, a plurality of third regions of high concentration of a second conductivity type and a second metal contact. The first region is disposed over the first metal contact. The second region is disposed over the first region. The plurality of third regions are disposed over the second region and the second metal contact is disposed over the third regions and over exposed portions of the second region.

An asymmetric snubber resistor in accordance with the present invention includes a cathode, an N+ region, an N− region, a plurality of P+ regions, and an anode. The N+ region is disposed over the cathode, the N− region is disposed over the N+ region, the plurality of P+ regions are disposed over the N− region, and the anode is disposed over the plurality of P+ regions and exposed portions of the N− region.

The asymmetric snubber resistor provides a number of advantages. The asymmetric snubber resistor can withstand some commonly occurring high peak currents and wattage which could not be handled by prior snubber resistors. The asymmetric snubber resistor also provides advantages of packaging which leads to a very tight layout, low stray inductance, and ease of manufacturing.

DETAILED DESCRIPTION OF THE INVENTION

Figure 3:
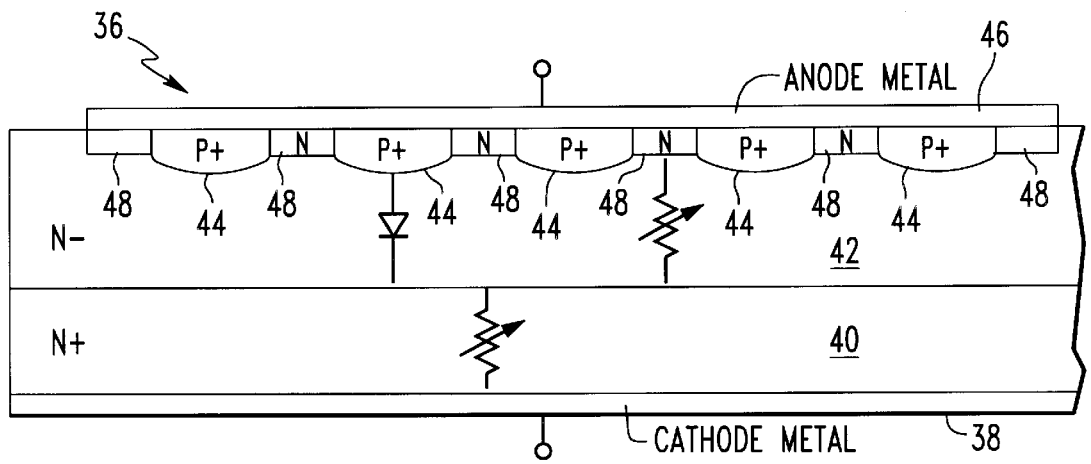
FIG. 3 is a cross sectional view of one embodiment of the asymmetric snubber resistor.

An asymmetric snubber resistor 36 in accordance with the present invention is illustrated in FIG. 3. The asymmetric snubber resistor 36 includes a cathode 38, an N+ region 40, an N− region 42, a plurality of P+ regions 44, and an anode 46. The asymmetric snubber resistor 36 may also include N regions 48. The asymmetric snubber resistor 36 can handle higher peak currents and watts than prior snubber circuits.

Figure 2:
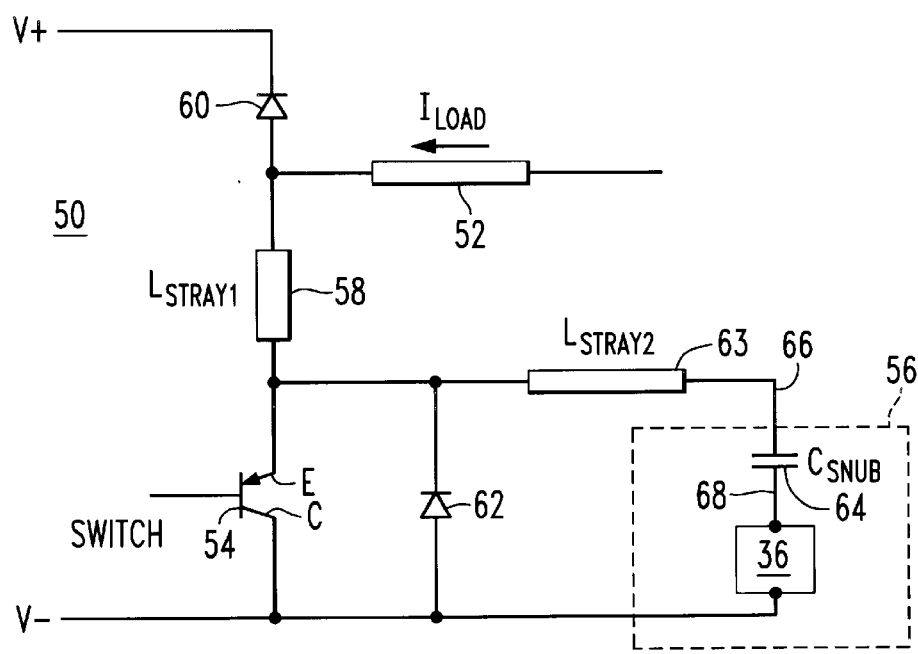
FIG. 2 is a diagram of a circuit with a transistor, an inductive load, and a snubber circuit with an asymmetric snubber resistor in accordance with the present invention.

Referring to FIG. 2, one example of a circuit 50 with an inductive load 52, a transistor 54, and a snubber circuit 56 with the asymmetric snubber resistor 36 is illustrated. The collector C of transistor 54 is coupled to a −V source and the emitter E of transistor 54 is coupled to a +V source. The inductive load 52 is coupled to the emitter E of transistor 54. The snubber circuit 56 is coupled in parallel with transistor 54 to the emitter E and collector C. A first load 58 and a first diode 60 are coupled in series between the emitter E and the +V source, a second diode 62 is also coupled in parallel with transistor 54 to the emitter E and collector C, and the second load 63 is coupled between the snubber circuit 56 and the emitter E. Although a bipolar transistor 54 is shown in this particular embodiment, other types of switches, such as a field effect transistor, could also be used.

Snubber circuit 56 comprises a snubber capacitor or $C_{snub}$ 64 and the asymmetric snubber resistor 36. The snubber capacitor 64 has first and second capacitor terminals 66 and 68 with the first capacitor terminal 66 coupled to the emitter E of transistor 54 and the second capacitor terminal 68 coupled to one terminal of the asymmetric snubber resistor 36. The other terminal of the asymmetric snubber resistor 36 is coupled to the collector C of transistor 54.

Referring to FIG. 3, the asymmetric snubber resistor 36 is illustrated. The asymmetric snubber resistor 36 includes the N+ region 40 which is disposed on the cathode 38. The N− region 42 is disposed over the N+ region 40. The plurality of P+ regions 44 are implanted in the N−region 42 and the N regions 48 are disposed between the plurality of P+ regions 44. The anode 46 is disposed over the P+ regions 44 and the N regions 48. In this particular embodiment, the N+ region 40 is between about 10 mils and 14 mils thick and the N− region 42 is between 1 mil and 5 mils thick. Typically, the N+ region 40 is between 0.5 microns to 60 mils thick and N− region 42 is between about 0.5 mils to 60 mils thick.

Figure 1:
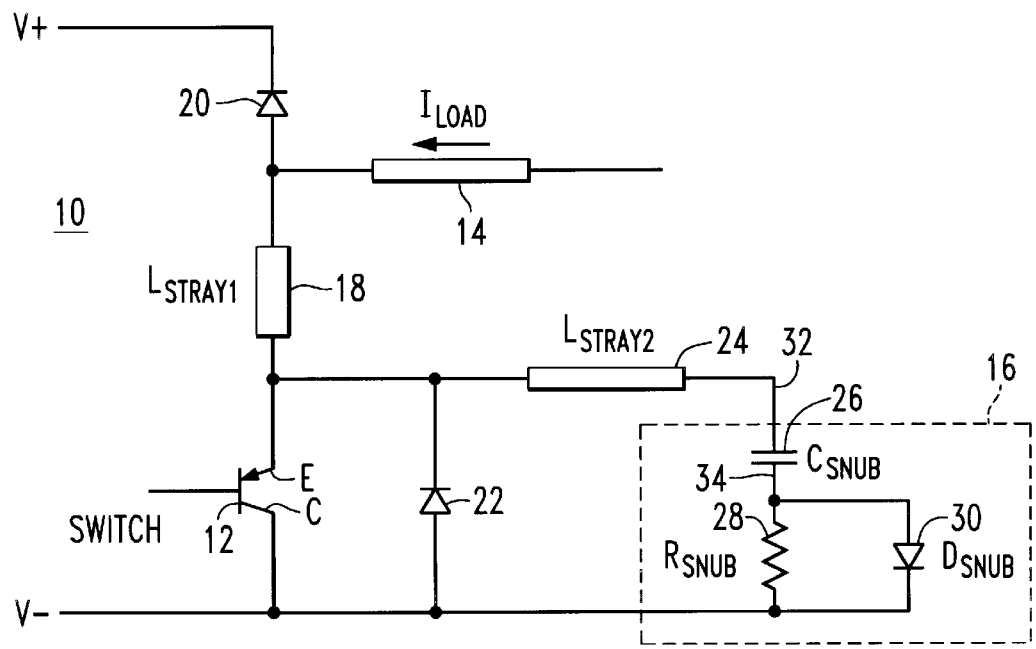
FIG. 1 is a diagram of a prior art snubber circuit in a circuit with a transistor and an inductive load.

The asymmetric snubber resistor 36 replaces the snubber diode 30 and snubber resistor 28 in a typical snubber circuit 10 as illustrated in FIG. 1. The snubber diode region of the asymmetric snubber resistor 36 is formed by the P+ regions 44 with the N− region 42. The diode region only operates like a diode in one direction because the asymmetric snubber resistor 36 has a number of shorts, i.e. the N regions 48 disposed between the plurality of P+ regions 44 which couple the N− region 42 to the anode 46. Accordingly, in the reverse direction the diode region of the asymmetric snubber resistor 36 does not block current. When the transistor 54 is off, the asymmetric snubber resistor 36 also includes a small resistance region which is in series with the diode region and is formed by the N+ region 40. When the transistor 56 is on, the snubber resistance region of the asymmetric snubber resistor 36 is formed by the N regions 48 and N− region 42. The snubber resistance region is a larger resistance then the small resistance region and is designed to discharge the charge stored in the snubber capacitor 64. In this particular embodiment, the resistance of the snubber resistance region when the asymmetric snubber resistor 36 is in the forward direction (transistor 56 off) ranges between 0.1 $\Omega/cm^2$ and 100 $\Omega/cm^2$ and the resistance of the small resistance region when the asymmetric snubber resistor 36 is in the reverse direction (transistor 56 on) ranges between 0.01 $m\Omega/cm^2$ and 100 $m\Omega/cm^2$.

Figure 4A:
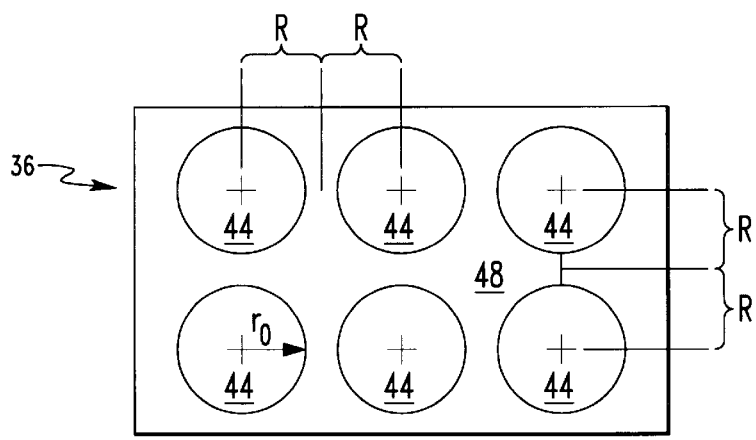
FIG. 4(a) is a top view of the asymmetric snubber resistor shown in FIG. 3 with the anode removed.

Referring to FIG. 4(a), a top view of the asymmetric snubber resistor 36 with the anode 46 removed is illustrated. As shown in this particular embodiment, each of the P+ regions 44 has a substantially circular shape with a radius $r_0$. The centers of each of the P+ regions 44 are separated from a centerline between each of the P+ regions 44 by a distance R. In this particular example, the P+ regions 44 each have a radius $r_0$ of about 10 $\mu$m and a distance R of 20 $\mu$m. Typically, the radius $r_0$ will range between $5\mu$ and $100\mu$ and the distance R will range between $7\mu$ and $200\mu$. The size of the P+ regions 44 and the spacing of the P+ regions 44 with respect to the N region 48 is important to uniformly distribute current over the asymmetric snubber resistor 36 to ensure that there is no surface arcing. Those skilled in the art will ensure that the surface concentrations of the N region 48 and P+ region 44 are suitably large for ohmic contact to whatever metal is used for anode 46.

Figure 4B:
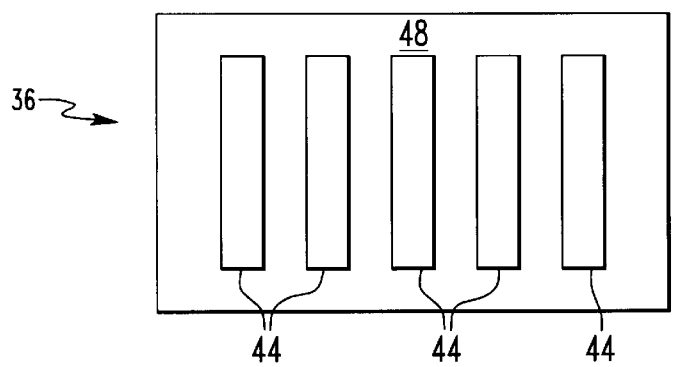
FIG. 4(b) is a top view of another embodiment of the asymmetric snubber resistor with the anode removed.

Referring to FIG. 4(b), a top view of another embodiment of the asymmetric snubber resistor 36 with the anode 46 removed is illustrated. As shown in this particular embodiment, each of the P+ regions 44 has a substantially rectangular shape, although the P+ regions 44 could have other shapes if desired. In this particular embodiment, the P+ regions 44 are spaced about 30 microns apart. Typically, the P+ regions 44 are spaced between about $7\mu$ and $200\mu$ apart.

Referring back to FIGS. 2 and 3, when the transistor 54 is off, the asymmetric snubber resistor 36 should act like a forward biased diode in series with a small, but variable resistance. The asymmetric snubber resistor 36 turns on with reasonably small current levels and with no significant delay. The asymmetric snubber resistor 36 also conducts the full load current $I_{load}$ from the inductive load 52 with a small forward drop.

When the transistor 54 is on, the asymmetric snubber resistor 36 acts like a resistor which discharges the snubber capacitor 64 within the time period the transistor 56 remains on. The asymmetric snubber resistor 36 also withstands the full rail voltage V+ without arcing or being destroyed during the discharge phase.

For purposes of illustration, one particular example of an asymmetric snubber resistor 36 designed for a 1000 volt and 500 amp application or module is discussed below. The same principles used for designing this asymmetric snubber resistor 36 can be used to design an asymmetric snubber resistor 36 for other voltage and current parameters.

As discussed above, when the transistor 54 is off, the diode region of the asymmetric snubber resistor 36 turns on with reasonably small current levels, with little delay, and with a small forward voltage drop. Accordingly, the minimum current density needed to turn on the diode region of the asymmetric snubber resistor 36 is calculated as follows:

$$J(R_s, R, r_0) = \frac{V_{eb}}{\left[ 0.5 * R^2 * \ln\left(\frac{R}{r_0}\right) - 0.25 * (R^2 - r_0^2) \right] * R_s(\rho)}$$

where $J(R_s,R,r_0)$ is the current density, $V_{eb}$ is the minimum forward voltage drop for the diode region, $R_s(\rho)$ is the sheet resistance of the N− region and $R_s(\rho)=\rho/t$ where $\rho$ is the resistivity of the N− region and t is the thickness of the N− region, R is the radius or distance from the center of a P+ region to a centerline between two P+ regions, and $r_0$ is the radius of each P+ region.

Figure 5:
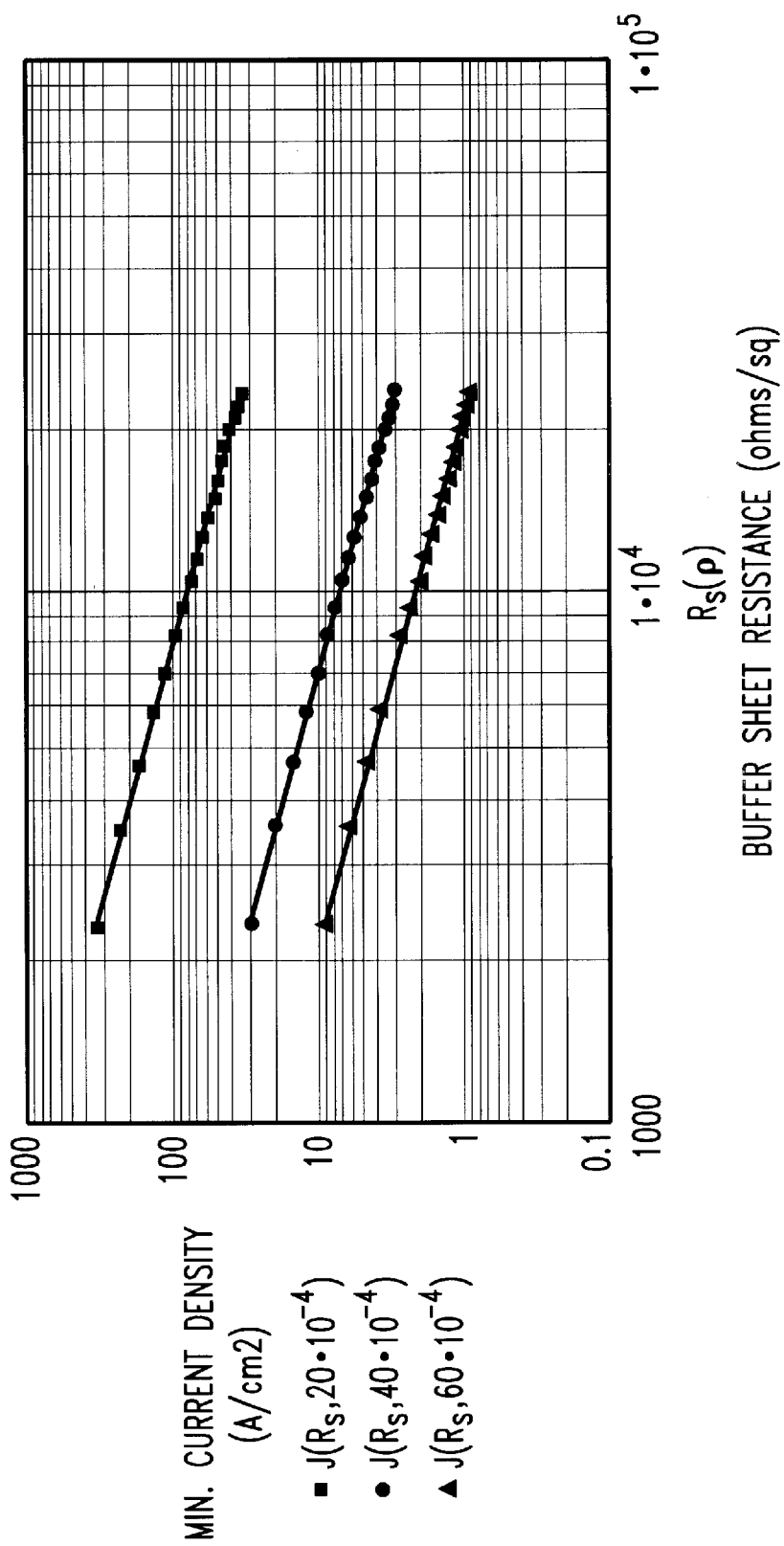
FIG. 5 is a graph of minimum current density v. buffer sheet resistance for the N− region and P+ regions in the asymmetric snubber resistor.

Assuming a minimum forward voltage drop $V_{eb}=0.5$ volts, a doping of the N− region in the range of $1.0\ e^{13}$ donors/cm³ to $1.0\ e^{14}$ donors/cm³, an associated resistivity $\rho$ in the range of about 40 ohms-cm to 400 ohms-cm, and a thickness t of the N− region of 172 $\mu$m, a radius $r_0$ for each P+ region of 10 $\mu$m, and a radius or distance R from the center of a P+ region to a centerline between two P+ regions of either 20 $\mu$m, 40 $\mu$m, or 60 $\mu$m then the minimum current densities needed to get $V_{eb}>0.5$ to turn the diode region on are shown by the graph in FIG. 5. The current density above each curve is the minimum required to forward bias the diode in the asymmetric snubber resistor 36.

As discussed earlier, when the transistor 54 is off the snubber diode region of the asymmetric snubber resistor 36 is in series with a small resistance region formed by the N+ region 40. The resistance of the small resistance region can be determined from $R_s(\rho)=\rho/t$, where $\rho$ is the resistivity of the N+ region 40 and t is the thickness of the N+ region 40. In this particular embodiment, the N+ region 40 has a resistivity $\rho$ of 0.01 $\Omega$cm and a thickness t of 10 mils and thus a resistance of 0.25 m$\Omega$. Ideally this resistance should be just large enough to dampen oscilations between first load 58 and snubber capacitor 64.

As discussed earlier, when the transistor 54 is on the asymmetric snubber resistor 36 acts like a resistor which discharges snubber capacitor 64 within the time period the transistor 54 remains on. The asymmetric snubber resistor 36 also withstands the full rail voltage V+ without arcing or being destroyed during the discharge phase of snubber capacitor 64.

The value for the resistance of the snubber resistance region can be determined from:

$$V_{c\ snubber} = (V+) * e^{-\frac{t}{\tau}}$$

where $\tau=r*c$ with r being the value of the resistance of the snubber resistance region, c being the value of the snubber capacitor, and $t_{(on\ minimum)}>3\tau$. In this particular embodiment, assuming a minimum on time t for the transistor 54 is in the 2–5$\mu$ sec range and a snubber capacitor value of about 0.1 $\mu$F, then the value of r for the resistance of the snubber resistance region for the asymmetric snubber resistor 36 should be in the range of 6–15 ohms.

Additionally, the snubber resistance region of the asymmetric snubber resistor 36 must also have enough resistance to handle the peak current. The value of the resistance for the snubber resistance region also needs to be calculated by solving for $r_{discharge}$ in the following equation with the realization that reduced $I_{pk}$ will lead to less thermal shock each time snubber capacitor 64 discharges:

$$I_{pk} = \frac{V+}{r_{discharge}}$$

Assuming an $I_{pk}$ of about 100 A and a rail voltage V+ of about 300V, then the resistance $r_{discharge}$ of the snubber resistance region should be 3 ohms. In this particular embodiment, the resistance $r_{discharge}$ of the snubber resistance region should range between 1 to 30 ohms. Accordingly, the overlapping portion of the range for the resistance of the snubber resistance region from the preceeding two equations should be used to design the asymmetric snubber resistor 36.

Referring to FIGS. 2 and 3, the operation of the asymmetric snubber resistor 36 can be illustrated. When the transistor 54 is open, the full load current $I_{load}$ is blocked from flowing through the transistor 54. Instead, the full load current $I_{load}$ is transferred to the snubber circuit 56 which charges the snubber capacitor 64 and turns the diode region, the P+ regions 44 and N– region 42, in the asymmetric snubber resistor 36 on. As discussed above, with reference to FIG. 5, the diode region of the asymmetric snubber resistor 36 turns on with a relatively small current level and is able to conduct the full load current $I_{load}$.

When the transistor 54 is closed, the full load current $I_{load}$ flows through the transistor 54. Meanwhile, the snubber capacitor 64 discharges through the snubber resistance region in the asymmetric snubber resistor 36. The diode region of the asymmetric snubber resistor 36, the P+ regions 44 and N– region 42, do not block the flow of current because of the N regions 48 located between the plurality of P+ regions 44 which creates a "lossy" or "leaky" diode region. The snubber resistance region of asymmetric snubber resistor 36 is able to discharge snubber capacitor 64 before the transistor 54 turns off again and is also able to handle the peak current $I_{pk}$ during discharge.

Having thus described the basic concept of the invention, it will be readily apparent to those skilled in the art that the foregoing detailed disclosure is intended to be presented by way of example only, and is not limiting. Various alterations, improvements and modifications will occur and are intended to those skilled in the art, though not expressly stated herein. These modifications, alterations, and improvements are intended to be suggested hereby, and are within the spirit and scope of the invention. Accordingly, the invention is limited only by the following claims and equivalents thereto.

What is claimed:

1. An asymmetric snubber resistor comprising:
    a cathode;
    an N+ region disposed on the cathode;
    an N– region disposed over the N+ region;
    a plurality of P+ regions disposed in the N– region; and
    an anode disposed on the plurality of P+ regions and exposed portions of the N– region between the plurality of P+ regions.

2. The asymmetric snubber resistor as set forth in claim 1 wherein each of the plurality of P+ regions has a circular shape with a radius ranging between 5$\mu$ and 100$\mu$.

3. The asymmetric snubber resistor as set forth in claim 2 wherein each of the plurality of P+ regions has a center and the centers are spaced between 7$\mu$ and 200$\mu$ apart.

4. The asymmetric snubber resistor as set forth in claim 1 wherein each of the plurality of P+ regions has a stripe shape and each of the plurality of P+ regions is separated between 7$\mu$ and 200$\mu$ apart.

5. The asymmetric snubber resistor as set forth in claim 1 wherein the N– region is between about 0.5 mils and 60 mils in thickness.

6. The asymmetric snubber resistor as set forth in claim 1 wherein the N+ region is between about 0.5 microns and 60 mils in thickness.

7. The asymmetric snubber resistor as set forth in claim 1 wherein the resistance of the asymmetric snubber resistor ranges between 0.01 m$\Omega$/cm$^2$ and 100 m$\Omega$/cm$^2$ in the forward direction and 0.1 $\Omega$/cm$^2$ and 100 $\Omega$/cm$^2$ in the reverse direction.

8. The asymmetric snubber resistor as set forth in claim 1 wherein the exposed portions of the N– region between the P+ regions are N regions.

9. A circuit comprising a transistor having a first terminal coupled to a first voltage source and a second terminal coupled to a second voltage source, an inductive load coupled to the first terminal of the transistor and a snubber circuit coupled to the first and second terminals, said snubber circuit comprising:
    a capacitor with first and second capacitor terminals, the first capacitor terminal coupled to the first terminal of the transistor,
    an anode coupled to the second capacitor terminal;
    a cathode coupled to the second terminal of the transistor;
    an N+ region disposed on the cathode;
    an N– region disposed on the N+ region; and
    a plurality of P+ regions disposed in the N– region, with the anode disposed on the P+ regions and exposed portions of the N– region between the plurality of P+ regions.

10. The circuit as set forth in claim 9 wherein the transistor is a bipolar transistor, the first terminal of the transistor is an emitter, and the second terminal of the transistor is a collector.

11. The circuit as set forth in claim 9 wherein the transistor is a field effect transistor, the first terminal of the transistor is a drain, and the second terminal of the transistor is a source.

12. The circuit as set forth in claim 9 wherein each of the plurality of P+ regions has a circular shape with a radius ranging between 5$\mu$ and 100$\mu$.

13. The circuit as set forth in claim 12 wherein each of the plurality of P+ regions has a center and the centers are spaced between 7µ and 200µ apart.

14. The circuit as set forth in claim 9 wherein each of the plurality of P+ regions has a stripe shape and each of the plurality of P+ regions is separated between 7µ and 200µ apart.

15. The circuit as set forth in claim 9 wherein the N− region is between about 0.5 mils and 60 mils in thickness.

16. The circuit as set forth in claim 9 wherein the N+ region is between about 0.5 microns and 60 mils in thickness.

17. The circuit as set forth in claim 9 wherein the resistance of the asymmetric snubber resistor ranges between 0.01 mΩ/cm$^2$ and 100 mΩ/cm$^2$ in the forward direction and 0.1 Ω/cm$^2$ and 100 Ω/cm$^2$ in the reverse direction.

18. The circuit as set forth in claim 9 wherein the exposed portions of the N− region between the P+ regions are N regions.

19. An asymmetric snubber resistor comprising:
a first electrode;
an P+ region disposed on the first electrode;
an P− region disposed over the P+ region;
a plurality of N+ regions disposed between exposed portions of the P− region; and
a second electrode disposed on the plurality of N+ regions and exposed portions of the N− region between the plurality of N+ regions.

20. An asymmetric snubber resistor comprising:
one electrode;
an P+ region disposed on the one electrode;
an P− region disposed over the P+ region;
a plurality of N+ regions disposed between exposed portions of the P− region; and
another electrode disposed on the plurality of N+ regions and exposed portions of the N− region between the plurality of N+ regions.

21. An asymmetric snubber resistor comprising:
one electrode;
an N+ region disposed on the one electrode;
an N− region disposed over the N+ region;
a plurality of P+ regions disposed between exposed portions of the N− region; and
another electrode disposed on the plurality of P+ regions and exposed portions of the P− region between the plurality of P+ regions.

22. A circuit comprising a transistor having a first terminal coupled to a first voltage source and second terminal connected coupled to a second voltage source, an inductive load coupled to the first terminal of the transistor and a snubber circuit coupled to the first and second terminals, said snubber circuit comprising:

a capacitor with first and second capacitor terminals, the first capacitor terminal coupled to the first terminal of the transistor;
one electrode coupled to the second capacitor terminal;
another electrode coupled to the second terminal of the transistor;
an N+ region disposed on the one electrode;
an N− region disposed on the N+ region;
a plurality of P+ regions disposed between exposed portions of the N− region, with the other electrode disposed on the P+ regions and exposed portions of the N− region between the plurality of P+ regions.

23. A circuit comprising a transistor having a first terminal coupled to a first voltage source and second terminal connected coupled to a second voltage source, an inductive load coupled to the first terminal of the transistor and a snubber circuit coupled to the first and second terminals, said snubber circuit comprising:

a capacitor with first and second capacitor terminals, the first capacitor terminal coupled to the first terminal of the transistor;
one electrode coupled to the second capacitor terminal;
another electrode coupled to the second terminal of the transistor;
an P+ region disposed on the other electrode;
an P− region disposed on the P+ region;
a plurality of N+ regions disposed between exposed portions of the P− region, with the one electrode disposed on the N+ regions and exposed portions of the P− region between the plurality of N+ regions.

24. A circuit comprising a transistor having a first terminal coupled to a first voltage source and second terminal connected coupled to a second voltage source, an inductive load coupled to the first terminal of the transistor and a snubber circuit coupled to the first and second terminals, said snubber circuit comprising:

a capacitor with first and second capacitor terminals, the first capacitor terminal coupled to the first terminal of the transistor;
one electrode coupled to the second capacitor terminal;
another electrode coupled to the second terminal of the transistor;
an P+ region disposed on the other electrode;
an P− region disposed on the P+ region;
a plurality of N+ regions disposed between exposed portions of the P− region, with the one electrode disposed on the N+ regions and exposed portions of the P− region between the plurality of N+ regions.

* * * * *